United States Patent
Je et al.

(10) Patent No.: US 8,528,499 B2
(45) Date of Patent: Sep. 10, 2013

(54) SUBSTRATE PROCESSING APPARATUS AND METHOD

(75) Inventors: Sung-Tae Je, Gumi-si (KR); Il-Kwang Yang, Yongin-si (KR); Chan-Yong Park, Icheon-si (KR)

(73) Assignee: Eugene Technology Co., Ltd., Yongin (KR)

( * ) Notice: Subject to any disclaimer, the term of this patent is extended or adjusted under 35 U.S.C. 154(b) by 0 days.

(21) Appl. No.: 12/934,419

(22) PCT Filed: Mar. 27, 2009

(86) PCT No.: PCT/KR2009/001566
§ 371 (c)(1),
(2), (4) Date: Sep. 27, 2010

(87) PCT Pub. No.: WO2009/120034
PCT Pub. Date: Oct. 1, 2009

(65) Prior Publication Data
US 2011/0028001 A1    Feb. 3, 2011

(30) Foreign Application Priority Data
Mar. 27, 2008 (KR) .................. 10-2008-0028250

(51) Int. Cl.
*C23C 16/00* (2006.01)
*C23C 16/50* (2006.01)

(52) U.S. Cl.
USPC ................. 118/723 R; 257/E21.482

(58) Field of Classification Search
USPC ............... 118/719, 715, 723 MW, 723 MR, 118/723 ME, 723 AN; 156/345.36, 345.41, 156/345.42; 435/758; 257/E21.482
See application file for complete search history.

(56) References Cited

U.S. PATENT DOCUMENTS

| | | | |
|---|---|---|---|
| 6,793,733 | B2 | 9/2004 | Janakiraman et al. |
| 7,930,992 | B2 * | 4/2011 | Nozawa et al. ........ 118/723 MW |
| 8,006,640 | B2 * | 8/2011 | Sasaki .................... 118/723 AN |
| 2002/0011215 | A1 * | 1/2002 | Tei et al. ............... 118/723 MW |
| 2003/0089314 | A1 * | 5/2003 | Matsuki et al. ................ 118/715 |
| 2004/0094094 | A1 * | 5/2004 | Ohmi et al. ........... 118/723 MW |
| 2005/0183826 | A1 * | 8/2005 | Choi et al. ............... 156/345.34 |

FOREIGN PATENT DOCUMENTS

| | | |
|---|---|---|
| JP | 2000-269146 A | 9/2000 |
| KR | 10-2000-0062949 A | 10/2000 |
| KR | 10-2006-0101479 A | 9/2006 |
| KR | 10-2007-0088184 A | 8/2007 |

OTHER PUBLICATIONS

International Search Report for International Patent Application No. PCT/KR2009/001566.

* cited by examiner

*Primary Examiner* — Jarrett Stark
(74) *Attorney, Agent, or Firm* — LRK Patent Law Firm

(57) ABSTRACT

Disclosed is a substrate processing apparatus and method. The substrate processing apparatus includes a process chamber (10) providing an internal space, in which a process is carried out onto a substrate; a support member (30) installed in the process chamber (10) to support the substrate; and a shower head (20) located above the support member (30) to supply a source gas toward the support member (30), wherein the shower head (20) includes a first injection surface (24) located at a position separated from the upper surface of the substrate by a first distance, and provided with outlets of first injection holes (24a) to inject the source gas; and a second injection surface (26) located at a position separated from the upper surface of the substrate by a second distance being different from the first distance, and provided with outlets of second injection holes (26a) to inject the source gas.

5 Claims, 3 Drawing Sheets

SUBSTRATE PROCESSING APPARATUS AND METHOD

TECHNICAL FIELD

The present invention relates to a substrate processing apparatus and method, and more particularly to a substrate processing apparatus and method, in which a shower head to supply a source gas is provided.

BACKGROUND ART

A semiconductor device has many layers on a silicon substrate, and these layers are formed on the silicon substrate by a deposition process. Such a deposition process has several important issues, and these issues are essential to evaluation of deposited films and selection of deposition methods.

The first issue is the quality of deposited films. The quality means a composition, a contamination level, a defect density, and mechanical and electrical properties of the deposited films. The compositions of the films are varied according to deposition conditions, and are important to obtain a specific composition.

The second issue is the uniform thickness of the deposited films throughout a wafer. Particularly, the thickness of a film deposited on the upper surface of a nonplanar pattern having steps is important. Whether or not the thickness of the deposited film is uniform is determined through a step coverage, which is defined by a value obtained by dividing the minimum thickness of the film deposited on a stepped portion by the thickness of the film deposited on the upper surface of the pattern.

Another issue relating to deposition is space filling. This filling includes gap filling, in which gaps between metal lines are filled with an insulating film including an oxide film. The gaps are provided to physically and electrically insulate the metal lines from each other.

DISCLOSURE OF INVENTION

Technical Problem

Therefore, the present invention has been made in view of the above problems, and it is an object of the present invention to provide a substrate processing apparatus and method, in which process uniformity on the front surface of a substrate is increased.

It is another object of the present invention to provide a substrate processing apparatus and method, in which a film having a uniform thickness is deposited on a substrate.

It is a further object of the present invention to provide a substrate processing apparatus and method, in which the performance of a semiconductor device is improved.

Technical Solution

In accordance with an aspect of the present invention, the above and other objects can be accomplished by the provision of a substrate processing apparatus comprising a process chamber providing an internal space, in which a process is carried out onto a substrate; a support member installed in the process chamber to support the substrate; and a shower head located above the support member to supply a source gas toward the support member, wherein the shower head includes a first injection surface located at a position separated from the upper surface of the substrate placed on the support member by a first distance, and provided with outlets of first injection holes to inject the source gas; and a second injection surface located at a position separated from the upper surface of the substrate placed on the support member by a second distance being different from the first distance, and provided with outlets of second injection holes to inject the source gas.

The first distance may be larger than the second distance; and the second injection surface may be formed in a circular ring shape.

The first distance may be larger than the second distance; and the second injection surface may be formed in a rectangular ring shape.

In accordance with another aspect of the present invention, there is provided a substrate processing apparatus comprising a process chamber providing an internal space, in which a process is carried out onto a substrate; a support member installed in the process chamber to support the substrate; and a shower head located above the support member, and including a plurality of first injection holes and a plurality of second injection holes to supply a source gas toward the support member, wherein outlets of the second injection holes are closer to the substrate than outlets of the first injection holes.

In accordance with a further aspect of the present invention, there is provided a substrate processing method, in which a source gas is supplied to a substrate to process the substrate, comprising supplying the source gas to the substrate using first injection holes separated from the upper surface of the substrate by a first distance and second injection holes separated from the upper surface of the substrate by a second distance, wherein the first distance is different from the second distance.

Advantageous Effects

The substrate processing apparatus and method in accordance with the present invention increases process uniformity on the front surface of a substrate. Further, the substrate processing apparatus and method allows a film having a uniform thickness to be deposited on the substrate.

BRIEF DESCRIPTION OF DRAWINGS

The above and other objects, features and other advantages of the present invention will be more clearly understood from the following detailed description taken in conjunction with the accompanying drawings, in which.

BEST MODE FOR CARRYING OUT THE INVENTION

Figure 1:
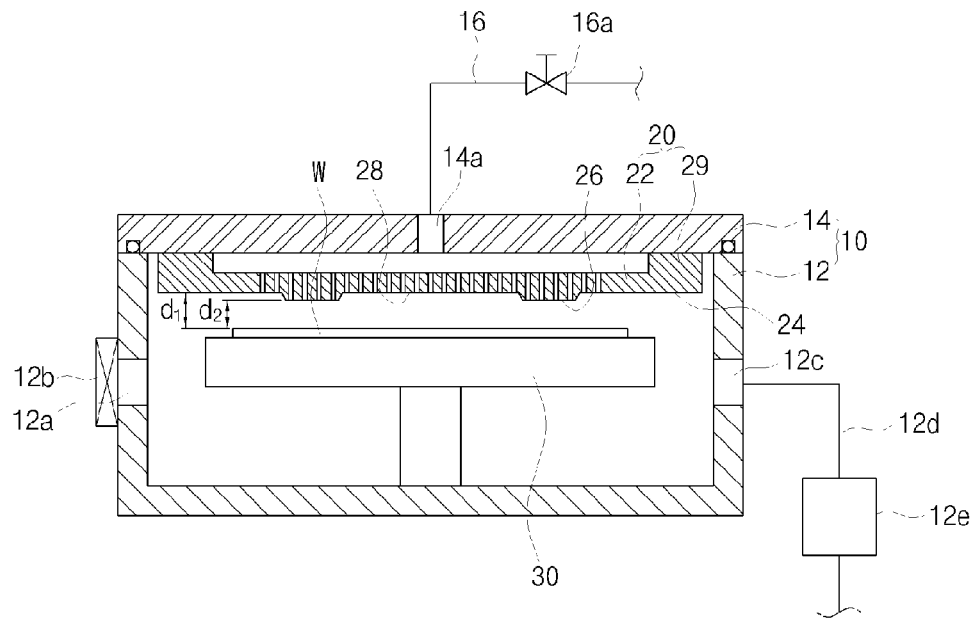
FIG. 1 is a view schematically illustrating a substrate processing apparatus in accordance with one embodiment of the present invention.

Hereinafter, preferred embodiments of the present invention will be described in more detail with reference to FIGS. 1 to 5. The embodiments of the present invention may be variously modified, and the scope and spirit of the present invention is not limited to the embodiments, which will be described below. These embodiments are provided to those skilled in the art only for illustrative purposes. Therefore, shapes of respective elements shown in the drawings may be exaggerated for a better understanding of the present invention.

Although a deposition apparatus will be exemplarily described below, the present invention may be applied to various processes.

FIG. 1 is a view schematically illustrating a substrate processing apparatus in accordance with one embodiment of the present invention. The substrate processing apparatus includes a chamber 10, and a deposition process is carried out on a substrate W in the chamber 10. The chamber 10 includes a lower chamber 12, the upper portion of which is opened, and an upper chamber 14, which opens and closes the opened upper portion of the lower chamber 12. The inside of the chamber 10 is cut off from the outside of the chamber 10. A support member 30 to horizontally support the substrate W is disposed in the lower chamber 12.

A gate 12a, through which the substrate W enters into and exits from the chamber 10, is formed through one side of the lower chamber 12, and is opened and closed by a gate valve 12b. An exhaust hole 12c is formed through the other side of the lower chamber 12, and an exhaust line 12d is connected to the exhaust hole 12c. A process gas and by-products in the chamber 10 are exhausted to the outside of the chamber 10 through the exhaust hole 12c and the exhaust line 12d. Further, the inside of the chamber 10 is decompressed to a designated degree of a vacuum through the exhaust hole 12c. A pump 12e is installed on the exhaust line 12d, and serves to forcibly exhaust the by-products, etc.

As shown in FIG. 1, a shower head 20 is installed on the ceiling of the chamber 10. The shower head 20 supplies a source gas supplied from a gas supply line 16 toward the support member 30, and the gas supply line 16 is opened and closed by a valve 16a. A through hole 14a is formed through the upper chamber 14a, and the gas supply line 16 is connected to the through hole 14a. The source gas is supplied to the inside of the shower head 20 through the gas supply line 16 and the through hole 14a.

The shower head 20 includes an injection plate 22 and a supporter 29, and the injection plate 22 is disposed approximately parallel with the upper surface of the support member 30 (or the substrate W). The supporter 29 fixes the injection plate 22 to the upper chamber 14, and forms a buffering space between the upper surface of the injection plate 22 and the upper chamber 14. The source gas supplied through the through hole 14a is diffused in the buffering space, and is injected onto the substrate W through injection holes, which will be described below.

Figure 2:
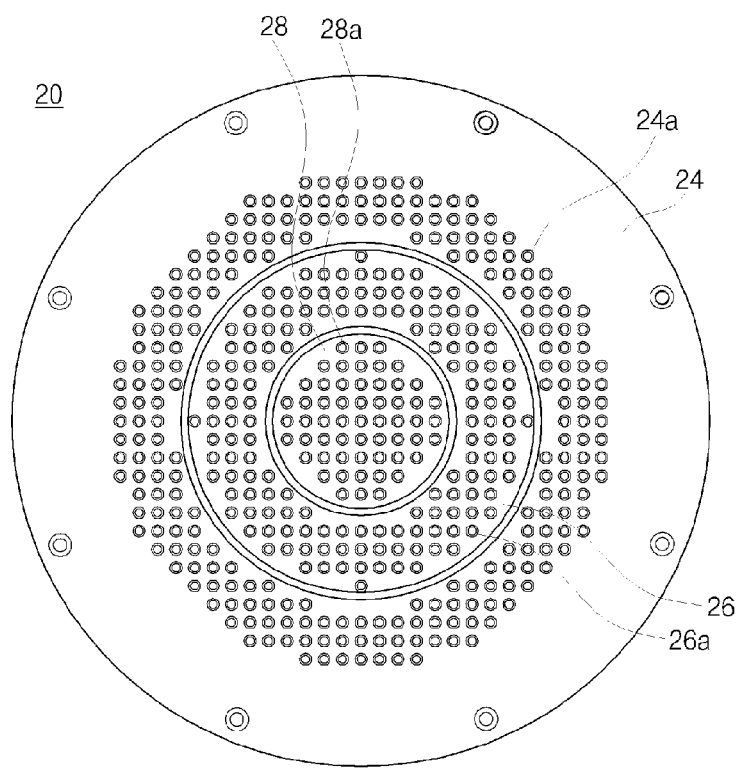
FIG. 2 is a bottom view illustrating a shower head of FIG. 1.

FIG. 2 is a bottom view illustrating the shower head 20 of FIG. 1. The injection plate 22 includes first, second, and third injection surfaces 24, 26, and 28. The first, second, and third injection surfaces 24, 26, and 28 are disposed opposite to the upper surface of the substrate W placed on the support member 30. The third injection surface 28 is disposed to correspond to the center of the substrate W, the second injection surface 26 is disposed to surround the third injection surface 28, and the first injection surface 24 is disposed to surround the second injection surface 26. The first and second injection surfaces 24 and 26 are formed in a ring shape, and the third injection surface 28 is formed in a circular shape.

A plurality of injection holes 24a, 26a, and 28a are formed through the shower head 20. The injection holes 24a, 26a, and 28a inject a source gas toward the substrate W placed on the support member 30. The first injection holes 24a are formed through the first injection surface 24, the second injection holes 26a are formed through the second injection surface 26, and the third injection holes 28a are formed through the third injection surface 28.

As shown in FIG. 1, the first and third injection surfaces 24 and 28 maintain a first distance $d_1$ with the upper surface of the substrate W, and the second injection surface 26 maintains a second distance $d_2$ with the upper surface of the substrate W. Therefore, outlets (lower ends) of the first and third injection holes 24a and 28a are located at a position separated from the upper surface of the substrate W by the first distance $d_1$, and outlets (lower ends) of the second injection holes 26a are located at a position separated from the upper surface of the substrate W by the second distance $d_2$.

Although this embodiment illustrates that the first, second, and third injection holes 24a, 26a, and 28a have the same diameter, the first, second, and third injection holes 24a, 26a, and 28a may have different diameters.

Figure 3:
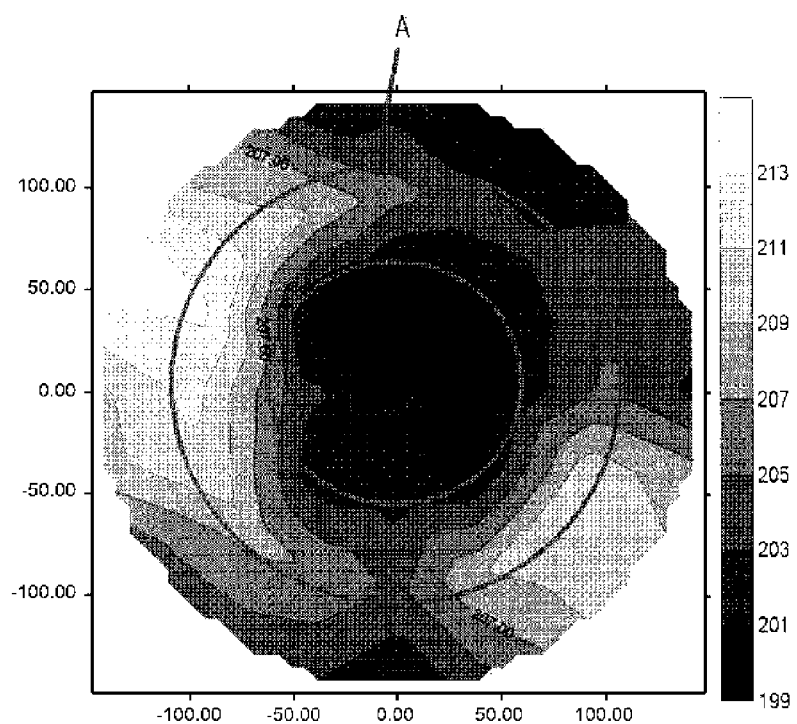
FIG. 3 is a thickness distribution chart of a film illustrating a process result using a conventional shower head.
Figure 4:
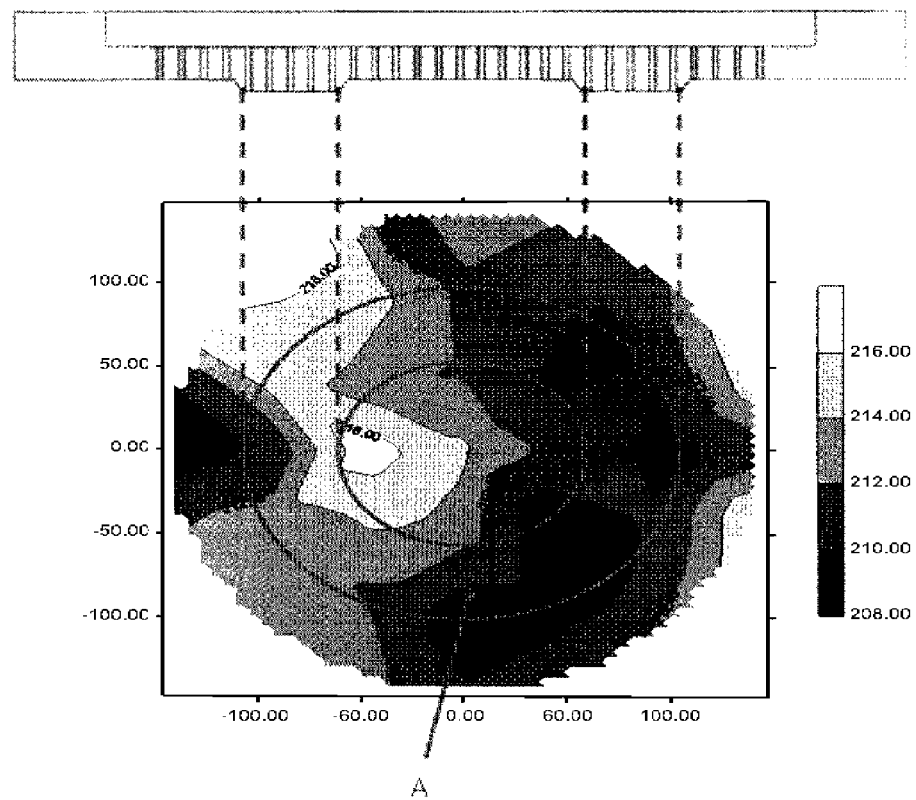
FIG. 4 is a thickness distribution chart of a film illustrating a process result using the shower head of FIG. 1.

FIG. 3 is a thickness distribution chart of a film illustrating a process result using a conventional shower head, and FIG. 4 is a thickness distribution chart of a film illustrating a process result using the shower head of FIG. 1. In each of these drawings, a bar shown at the right side is a reference bar illustrating a brightness distribution according to the thickness of the film.

The shower head 20 of FIG. 1 includes the first, second, and third injection surfaces 24, 26, and 28 having different heights, but the conventional shower head includes an injection surface having a uniform height. The process result using the conventional shower head is as follows (with reference to FIG. 3).

Average thickness (Avg.) of film=approximately 205.5 Å

Minimum average thickness (Min.) of film=approximately 198.9 Å

Maximum average thickness (Max.) of film=approximately 213.59 Å

Range=approximately 14.684 Å

Uniformity=approximately 3.57%

The distribution chart shown in FIG. 3 may be caused by various reasons. For example, the thickness distribution of the film, as shown in FIG. 3, may be obtained due to the non-uniformity of the temperature distribution of the support member 30 (or the temperature characteristics of a heater (not shown) installed in the support member 30). Here, in order to decrease the thickness of the film at a region A to improve the uniformity, the injection surface of the shower head 20 corresponding to the region A is processed such that the processed injection surface can be closer to the substrate W. That is, as shown in FIG. 1, the second injection surface 26 corresponding to the region A is closer to the upper surface of the substrate W than the first and second injection surfaces 24 and 28. Therefore, the outlets (the lower ends) of the second injection holes 26a are closer to the upper surface of the substrate W than the outlets (lower ends) of the first and third injection holes 24a and 28a, and the second injection holes 26a located at the position being close to the substrate W injects the source gas onto the substrate W. The process result using the shower head 20 of FIG. 1 is as follows (with reference to FIG. 4).

Average thickness (Avg.) of film=approximately 212.44 Å

Minimum average thickness (Min.) of film=approximately 208.29 Å

Maximum average thickness (Max.) of film=approximately 217.18 Å

Range=approximately 8.89 Å

Uniformity=approximately 2.09%

Particularly, it was proven that the thickness of the film at the region A corresponding to the second injection surface 26 is decreased, and thereby it was confirmed that the uniformity of the film is improved.

After the thickness distribution of the film according to the process result using the conventional shower head, is measured, in order to decrease the thickness of the film at a specific region, the injection surface of the shower head corresponding to the specific region is processed by the above method, thus being capable of decreasing the thickness of the film at the specific region and improving the uniformity of the film. In case that the above method is repeatedly carried out, the uniformity of the film can be highly improved. Further, a plurality of specific regions may be present, and thereby the injection surface of the shower head may be divided into a plurality of regions and the regions may be separately processed.

Figure 5:
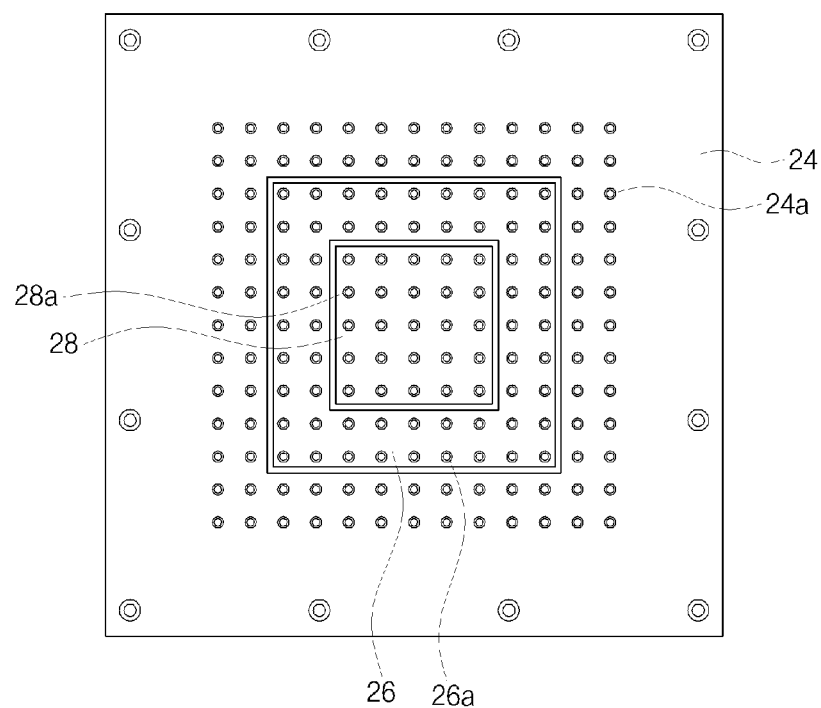
FIG. 5 is a bottom view illustrating a shower head in accordance with another embodiment of the present invention.

FIG. 5 is a bottom view illustrating a shower head 20 in accordance with another embodiment of the present invention.

The shower head 20 shown in FIG. 4 is applied to semiconductor manufacturing equipment, and the shower head 20 shown in FIG. 5 is applied to liquid crystal display equipment. A part of the construction and operation of the former embodiment is applied to this embodiment of FIG. 5, and thus a detailed description thereof will be omitted because it is considered to be unnecessary.

Although this embodiment illustrates that the second injection surface 26 is closer to the upper surface of the substrate W than the first and third injection surfaces 24 and 28, the first injection surface 24 or the third injection surface 28 may be closer to the upper surface of the substrate W than the second injection surface 26. That is, by dividing the injection surface of the shower head 20 into a plurality of regions according to the process result and differing separation distances between the respective regions and the upper surface of the substrate W from each other, it is possible to adjust the thickness distribution of the film and the uniformity of the film.

INDUSTRIAL APPLICABILITY

The substrate processing apparatus and method in accordance with the present invention increases process uniformity on the front surface of a substrate. Further, the substrate processing apparatus and method allows a film having a uniform thickness to be deposited on the substrate.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A substrate processing method, in which a source gas is supplied to a substrate disposed on a support member, a heater being installed in the support member, to deposit a film on a surface of the substrate, the method comprising:

depositing a dummy film using a flat-type shower head installed above the support member on a dummy substrate, the flat-type shower head having a plurality of injection holes and outlets of the injection holes having a substantially uniform height, and the injection holes supplying the source gas toward the support member;

measuring thickness distribution of the dummy film; and depositing a film on a substrate using a non-flat-type shower head that is installed above the support member and has a plurality of first injection holes and a plurality of second injection holes, outlets of the second injection holes being positioned to be closer to the substrate than outlets of the first injection holes, and the first injection holes and the second injection holes supplying the source gas toward the support member, wherein the second injection holes are positioned to a part corresponding to a relatively thicker region of the dummy film than other regions of the dummy film and the first injection holes are positioned to the other regions of the dummy film.

2. A method for manufacturing a shower head injecting a source gas toward a surface of a substrate for depositing a film on the surface of the substrate, the substrate being disposed on a support member in which a heater is installed, the method comprising:

depositing a dummy film using a flat-type shower head installed above the support member on a dummy substrate, the flat-type shower head including a flat-type injection surface that has a substantially uniform height and a plurality of injection holes formed in the flat-type injection surface, and the injection holes supplying the source gas toward the support member;

measuring thickness distribution of the dummy film;

manufacturing a non-flat-type shower head being installed above the support member and including a first injection surface and a second injection surface, the first injection surface and the second injection surface having different heights, and the second injection surface being positioned to be closer to a substrate than the first injection surface; and forming a plurality of first injection holes and a plurality of second injection holes on the first injection surface and the second injection surface for supplying the source gas toward the support member, respectively, wherein the second injection surface has a shape that corresponds to a relatively thicker region of the dummy film than other regions of the dummy film.

3. The method according to claim 2, wherein the second injection surface has a circular ring shape.

4. The method according to claim 2, wherein the second injection surface has a rectangular ring shape.

5. A method for manufacturing a shower head injecting a source gas toward a surface of a substrate for depositing a film on the surface of the substrate, the substrate being disposed on a support member in which a heater is installed, the method comprising:

depositing a dummy film using a flat-type shower head installed above the support member on a dummy substrate, the flat-type shower head having a plurality of injection holes and outlets of the injection holes having, a substantially uniform height, and the injection holes supplying the source gas toward the support member;

measuring thickness distribution of the dummy film; and manufacturing a non-flat-type shower head being installed above the support member and having a plurality of first injection holes and a plurality of second injection holes for supplying the source gas toward the support member, outlets of the second injection holes being positioned to be closer to a substrate than outlets of the first injection holes,
wherein the second injection holes are positioned to correspond to a relatively thicker region of the dummy film than other regions of the dummy film.

\* \* \* \* \*